United States Patent
Norman

(10) Patent No.: US 7,539,811 B2
(45) Date of Patent: May 26, 2009

(54) SCALEABLE MEMORY SYSTEMS USING THIRD DIMENSION MEMORY

(75) Inventor: Robert Norman, Blaine, WA (US)

(73) Assignee: Unity Semiconductor Corporation

( * ) Notice: Subject to any disclaimer, the term of this patent is extended or adjusted under 35 U.S.C. 154(b) by 489 days.

(21) Appl. No.: 11/543,502

(22) Filed: Oct. 5, 2006

(65) Prior Publication Data

US 2008/0084727 A1    Apr. 10, 2008

(51) Int. Cl.
*G06F 12/00* (2006.01)

(52) U.S. Cl. ............... 711/5; 711/103; 711/154; 711/170; 711/211; 365/230.01; 365/230.02; 365/230.03; 365/230.08; 365/189.02

(58) Field of Classification Search ............ None
See application file for complete search history.

(56) References Cited

U.S. PATENT DOCUMENTS

| | | | |
|---|---|---|---|
| 3,886,577 A | 5/1975 | Buckley | |
| 5,296,716 A | 3/1994 | Ovshinsky et al. | |
| 6,204,139 B1 | 3/2001 | Liu et al. | |
| 6,473,332 B1 | 10/2002 | Ignatiev et al. | |
| 6,487,106 B1 | 11/2002 | Kozicki | |
| 6,531,371 B2 | 3/2003 | Hsu et al. | |
| 6,657,888 B1 | 12/2003 | Doudin et al. | |
| 6,731,528 B2 | 5/2004 | Hush et al. | |
| 6,753,561 B1 | 6/2004 | Rinerson et al. | |
| 6,807,088 B2 | 10/2004 | Tsuchida | |
| 6,825,489 B2 | 11/2004 | Kozicki | |
| 6,836,421 B2 | 12/2004 | Rinerson et al. | |
| 6,856,536 B2 | 2/2005 | Rinerson et al. | |
| 7,002,197 B2 | 2/2006 | Perner et al. | |
| 2003/0132456 A1 | 7/2003 | Miyai et al. | |
| 2004/0141369 A1 | 7/2004 | Noguchi | |
| 2005/0135148 A1 | 6/2005 | Chevallier et al. | |
| 2005/0151156 A1 | 7/2005 | Wu et al. | |
| 2006/0050598 A1 | 3/2006 | Rinerson et al. | |
| 2006/0164882 A1 | 7/2006 | Norman | |
| 2006/0171200 A1 | 8/2006 | Rinerson et al. | |
| 2008/0071978 A1* | 3/2008 | Chow et al. | ............ 711/103 |

OTHER PUBLICATIONS

U.S. Appl. No. 60/536,115, filed Jan. 13, 2003, Wu et al.

A.Baikalov, et al, "Field -driven hysteretic and reversible resistive switch at the Ag-Pr0.7Ca0.3MnO3 interface" Applied Physics Letters, vol. 83, No. 5, Aug. 4, 2003, pp. 957-959.

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

A. Sawa, et al, "Hysteric current-volyage characteristics and resisitance switching at a rectifying $Ti/Pr_{0.7}Ca_{0.3}MnO_3$ interface" Applied Physics Letters, vol. 85, No. 18, Nov. 1, 2004, pp. 4073-4075.

(Continued)

*Primary Examiner*—Jack A Lane

(57) ABSTRACT

A non-volatile scalable memory circuit is described, including a bus formed on a substrate that includes active circuitry, metallization layers, and a plurality of high density third dimension memory arrays formed over the substrate. Each memory circuit can include an embedded controller for controlling data access to the memory arrays and optionally a control node that allows data access to be controlled by an external memory controller or by the embedded controller. The memory circuits can be chained together to increase memory capacity. The memory arrays can be two-terminal cross-point arrays that may be stacked upon one another.

7 Claims, 7 Drawing Sheets

OTHER PUBLICATIONS

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, "New Conduction and Reversible Memory Phenomena in Thin Insulating Films," Proc. Roy. Soc. A., 301 (1967), pp. 77-102.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

Liu et al., "Electric-pulse-induced reversible resistance change effect in magnetoresistive films," Applied Physics Letters, vol. 76, No. 19, May 8, 2000, pp. 2749-2751.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsh, Ch. Gerber, D. Widmer, A. Beck, "Current-driven insulator-conductor transition and nonvolatile memory in chromium-doped SrTiO3 single crystals," Applied Physics Letters, vol. 78, No. 23, Jun. 4, 2001, pp. 3738-3740.

R. Oligschlaeger, R. Waser, R. Meyer, S. Karthäuser, R. Dittmann, "Resistive switching and data reliability of epitaxial (Ba,Sr)TiO thin films," Applied Physics Letters, 88 (2006), 042901.

S. Lai, T. Lowrey, "OUM—A 180 nm nonvolatile memory cell element technology for standalone and embedded applications," IEEE International Electron Device Meeting, Technical Digest, 803 (2001).

J. Mizusaki J, Y. Yonemura, H. Kamata, K. Ohyama, N. Mori, H. Takai, H. Tagawa, M. Dokiya, K. Naraya, T. Sasamoto, H. Inaba, T. Hashimoto, "Electronic conductivity, Seebeck coefficient, defect and electronic structure of nonstoichiometric $La_{1-x}Sr_xMnO_3$," Solid State Ionics 132, 167 (2000).

Zhao Y. G.; Rajeswari M.; Srivastava R. C.; Biswas A.; Ogale S. B.; Kang D. J.; Prellier W.; Zhiyun Chen; Greene R. L.; Venkatesan T., "Effect of oxygen content on the structural, transport, and magnetic properties of $La_{1-delta}Mn_{1-delta}O_3$ thin films," Journal of Applied Physics, vol. 86, No. 11, Dec. 1999, pp. 6327-6330.

J. R. Stetter, W. R. Penrose, S. Yao, "Sensors, Chemical Sensors, Electrochemical Sensors, and ECS," Journal of The Electrochemical Society, 150 (2), S11-S16 (2003).

B. C. H. Steele, A. Heinzel, "Materials for Fuel-Cell Technologies," Nature 414, Nov. 2001, pp. 345-352.

A. Reller, J. M. Thomas, D. A. Jefferson, M. K. Uppal, "Superstructures Formed by the Ordering Vacancies in a Selective Oxidation Catalyst: Grossly Defective $CaMnO_3$," Proceedings of the Royal Society of London, vol. 394, No. 1807 Aug. 1984, pp. 223-241.

A. J. Millis, "Cooperative Jahn-Teller effect and electron-phonon coupling in $La_{1-x}A_xMnO_3$," Phys. Rev. B 53, 8434-8441 (1996).

U.S. Appl. No. 11/449,105, filed Jun. 6, 2006, Robert Norman.
U.S. Appl. No. 11/478,163, filed Jun. 28, 2006, Robert Norman.
U.S. Appl. No. 11/506,385, filed Aug. 16, 2006, Robert Norman.

\* cited by examiner

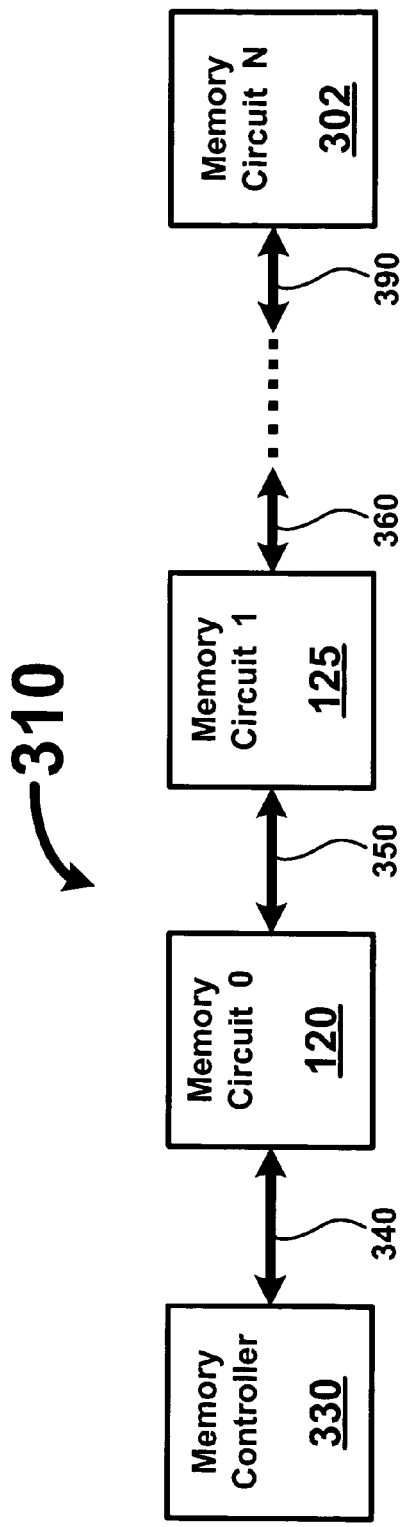
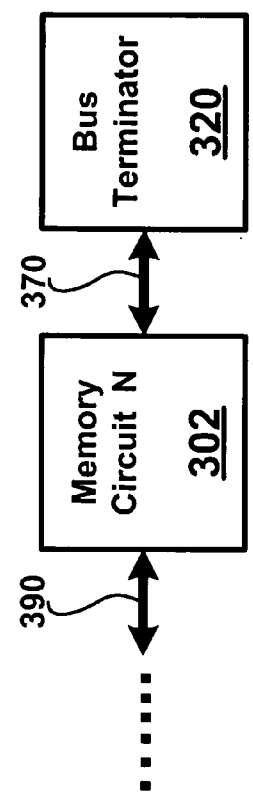
FIG. 3A
FIG. 3B

SCALEABLE MEMORY SYSTEMS USING THIRD DIMENSION MEMORY

BACKGROUND

1. Field of the Invention

The present invention relates to computer memory and more specifically to non-volatile memory.

2. Description of the Related Art

Memory can either be classified as volatile or nonvolatile. Volatile memory is memory that loses its contents when the power is turned off. In contrast, non-volatile memory does not require a continuous power supply to retain information.

The invention of non-volatile memory called "Flash" memory provided large capacity memory and reasonable write speeds. With flash it became possible to make systems using controllers and memory together to make flash memory systems that operate as mass storage for applications requiring low power and high ruggedness. Flash memory became popular because it is noiseless, has faster access than a hard disk, is smaller in size than a hard disk, and has no moving parts so it is more rugged than a hard disk. After the popularity of this card succeeded, many other versions of card were developed. Some conventional uses of Flash memory include: an additional disk drive for personal computers (PCs) and for portable equipment, personal portable electronic devices such as cell phones, PDA's, music players, etc., computer basic input/output systems (BIOS) chips, digital cameras, and memory cards for game consoles.

As electronic systems advance in capability and functions, the demand for higher memory capacity devices increases. This demand has pushed the development of ever increasing memory densities and of stacking of memory devices to obtain a high density. However, these solutions are often expensive. Thus, even with all the efforts to date, obtaining high capacity memory at a low cost point has eluded the market.

Conventionally, Flash memory is more expensive and has a lower capacity than a hard disk drive. Another problem associated with these cards is the write speed. Many applications require access speeds that are not possible with the existing technology. This often requires the system to buffer large blocks of data in dynamic random access memory (DRAM) or in static random access memory (SRAM), driving up system cost.

Continuing efforts are being made to improve memory systems.

BRIEF DESCRIPTION OF THE DRAWINGS

It is to be understood that, in the drawings, like reference numerals designate like structural elements. Also, it is understood that the depictions in the FIGS. are not necessarily to scale. Although various examples of the invention are disclosed in the accompanying drawings, the invention is not limited to those specific examples.

FIG. 3A is an exemplary representation of a scaleable memory system using the memory circuits of FIG. 1;

FIG. 3B is an exemplary representation of a bus terminator circuit coupled with a last memory circuit in the scaleable memory system of FIG. 3A;

DETAILED DESCRIPTION

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
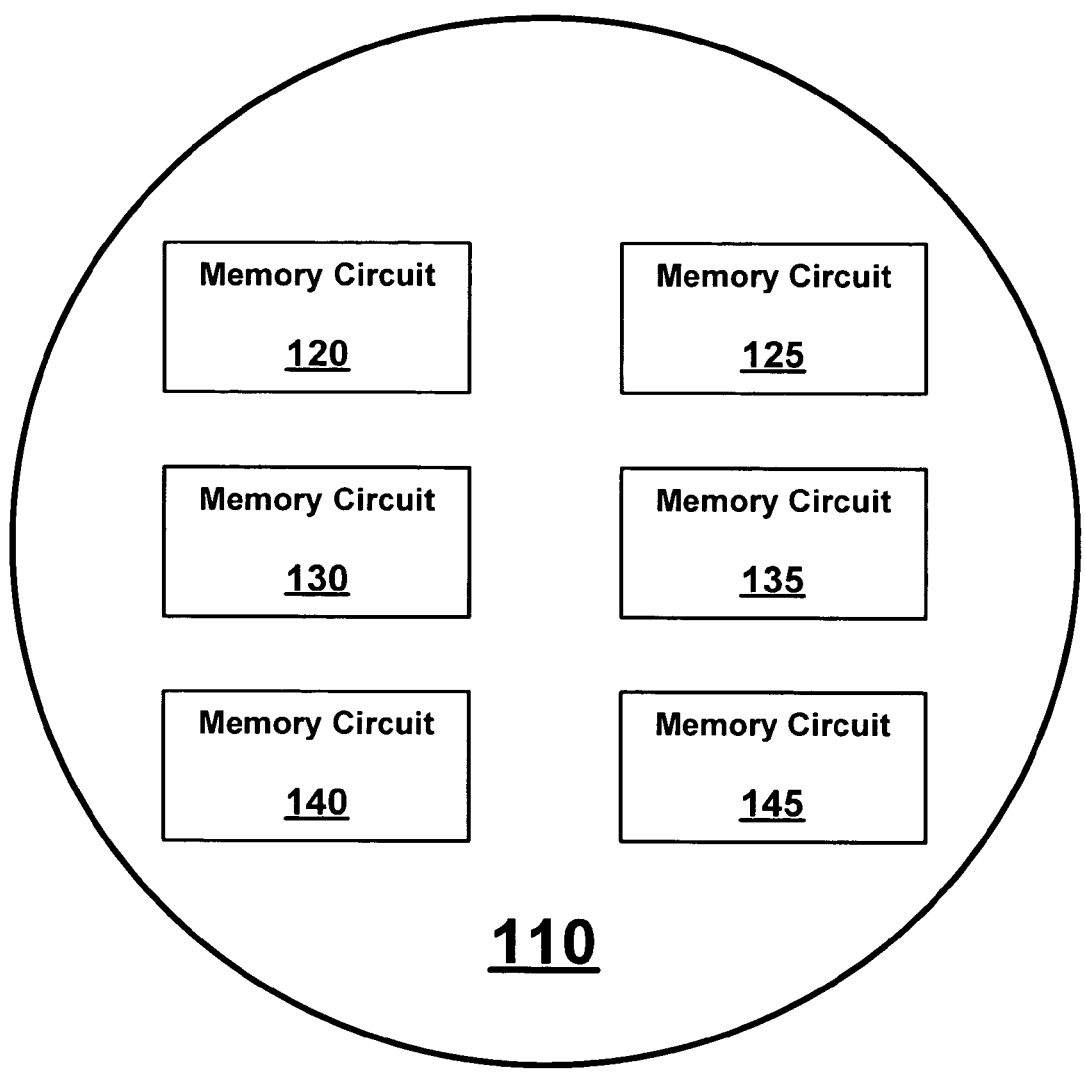
FIG. 1 is an exemplary representation of a wafer including multiple memory circuits.

FIG. 1 illustrates memory circuits 120, 125, 130, 135, 140 and 145 on a wafer 110. Each of the memory circuits 120-145 have been constructed by a combination of doping, etching, and depositions of various materials. After the memory circuits 120-145 have been constructed, wafer 110 is diced into individual dies with each die including one of the memory circuits. Although variations are possible, each individual die is typically attached to a support structure (a chip package, printed circuit board, or the like), bonded with the support structure's circuitry, and encapsulated with ceramic, plastic, epoxy or the like to prevent physical damage.

The construction of each memory circuit 120-145 on wafer 110 may be implemented using non-volatile third dimension memory arrays. A memory is "third dimension memory" when it is fabricated above other circuitry components, the components usually including a silicon substrate, polysilicon layers and, typically, metallization layers. The metallization layers can include interconnect structures that electrically couple the third dimension memory with the circuitry components fabricated in the substrate below the third dimension memory. By using non-volatile third dimension memory arrays, memory systems may be vertically-configured to reduce die size and not sacrifice overall chip functionality.

U.S. patent application Ser. No. 11/095,026, filed Mar. 30, 2005, and titled "Memory Using Mixed Valence Conductive Oxides," hereby incorporated by reference in its entirety and for all purposes, describes non-volatile third dimension memory cells that can be arranged in a cross-point array. The application describes a two terminal memory element that changes conductivity when exposed to an appropriate voltage drop across the two terminals. The memory element includes an electrolytic tunnel barrier and a mixed valence conductive oxide. A voltage drop across the electrolytic tunnel barrier causes an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites—PCMO and lanthanum-nickel-oxygen perovskites—LNO) change valence, their conductivity changes. Additionally, oxygen accumulation in certain electrolytic tunnel barriers (e.g., yttrium stabilized zirconia—YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms are reversible if the excess oxygen from the electrolytic tunnel barrier flows back into the mixed valence conductive oxide. A memory can be designed to exploit tunnel barrier height modification, tunnel barrier width modification, or both.

Both the electrolytic tunnel barrier and the mixed valence conductive oxide do not need to operate in a silicon substrate, and, therefore, can be fabricated above circuitry fabricated in the substrate and being used for other purposes (such as selection circuitry). Additionally, two-terminal memory elements can be arranged in a cross-point array such that one terminal is electrically coupled with an x-direction line and the other terminal is electrically coupled with a y-direction line. A stacked cross-point array consists of multiple cross-point arrays stacked upon one another, sometimes sharing x-direction and y-direction lines between layers, and sometimes having isolated lines. Both single-layer cross-point arrays and stacked cross-point arrays may be arranged as third dimension memories fabricated above a substrate including circuitry that allows data access to/from the third dimension memories.

Figure 2:
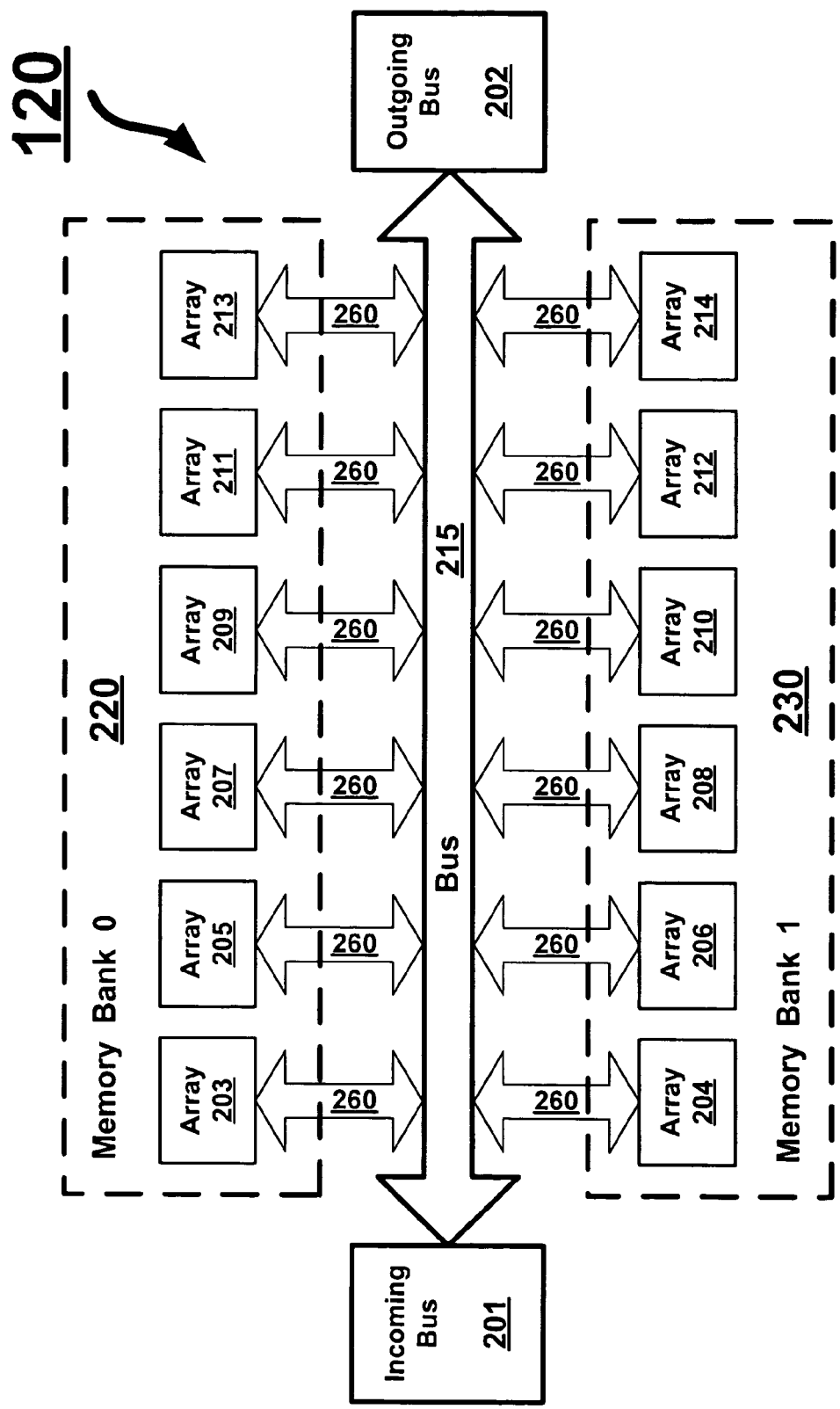
FIG. 2 is an exemplary representation of one of the multiple memory circuits of FIG. 1.

FIG. 2 is an exemplary representation of one of the memory circuits 120 constructed on the wafer 110. Memory circuit 120 includes an incoming bus 201 coupled to a plurality of high density third dimension memory arrays 203-214 through a bus 215. Memory circuit 120 includes memory bank "0" 220 and memory bank "1" 230. Memory bank "0" 220 includes memory arrays 203, 205, 207, 209, 211, and 213. Memory bank "1" 230 includes memory arrays 204, 206, 208, 210, 212, and 214 and the associated access circuitry (not shown) required to perform the memory requests on the memory arrays. Note that although a specific number of memory arrays and banks are shown, the configuration depicted in FIG. 2 is just one example of a memory circuit. The actual number of logical and/or physical partitions that are used is a design choice and the particular examples in the FIGS. are not intended to limit the scope of the claims. For example, the memory circuit 120 may include any number of memory banks and memory arrays.

Each memory bank 220-230 includes an interconnect structure 260 for electrical coupling to the bus 215, thus eliminating the need for wire bonding. The interconnect 260 can be a bus that allows address, data signals, and controls signals. Bus 215 accepts input via incoming bus 201 and drives outputs via outgoing bus 202. Outgoing bus 202 can be coupled to another memory circuit in a daisy-chain fashion as shown in FIG. 3. For example, the outgoing bus 202 can be used to couple the memory circuit 120 to the incoming bus of another memory circuit in the daisy-chain. The incoming bus 201 and outgoing bus 202 can be configured as logic connected to busses. The number of interconnects that comprise a bus is a design choice that will be application dependent. The term bus as used herein includes single or multiple interconnect structures operative to electrically communicate a signal or implement an interface (e.g., serial or parallel). Therefore, the particular examples depicted in the FIGS. are not intended to limit the scope of the claims.

FIG. 3A is an exemplary representation of a scaleable memory system 310. Here a memory controller 330 is located outside the memory circuits 120, 125 and 302 and may be coupled to several memory circuits 120, 125 and 302 in a high density or expanded system. Scaleable memory system 310 includes memory circuit "0" 120, memory circuit "1" 125, up to memory circuit "N" 302. The memory circuits may be chained together such that an input 340 into memory circuit 120 may be re-driven at the outgoing bus 202, and an output 350 may be input into the incoming bus of memory circuit 125.

Those skilled in the art will appreciate that a bus terminator may be required to terminate the bus 215 to reduce or eliminate signal distortions caused by ringing and/or signal reflections caused by impedance mismatches. Typically, the ringing and/or impedance mismatch are caused when the bus 215 is left unterminated or is not terminated in its characteristic impedance. If a bus terminator is required, it could be added to the outgoing bus of memory circuit 302 or memory circuit 302 might be specially designed to have a bus terminator instead of an outgoing bus. FIG. 3B depicts an exemplary bus terminator circuit 320 coupled 370 with outgoing bus of the last memory circuit 302 in the chain. For example, the bus terminator circuit 320 can include a resistor network or an impedance matching circuit that matches a characteristic impedance of the outgoing block 202. In some implementations no terminator is required and the end output port not connected to another unit is turned of to save power.

Memory controller 330 is a smart controller in that it can determine the amount of memory in the system and it can decode or parse the addresses of an incoming message to determine if the message should be passed on to a member of its chain (i.e., memory circuits 120, 125, . . . , 302). Each memory circuit 120, 125 and 302 includes an interface and a memory register. Each memory register stores the address of its respective memory circuit. The serial interface determines if the address in the incoming message matches the address in the memory register indicating that the message is directed to that memory circuit. Alternatively, some of the controller 330 functions can be moved to each individual memory circuit.

Figure 4:
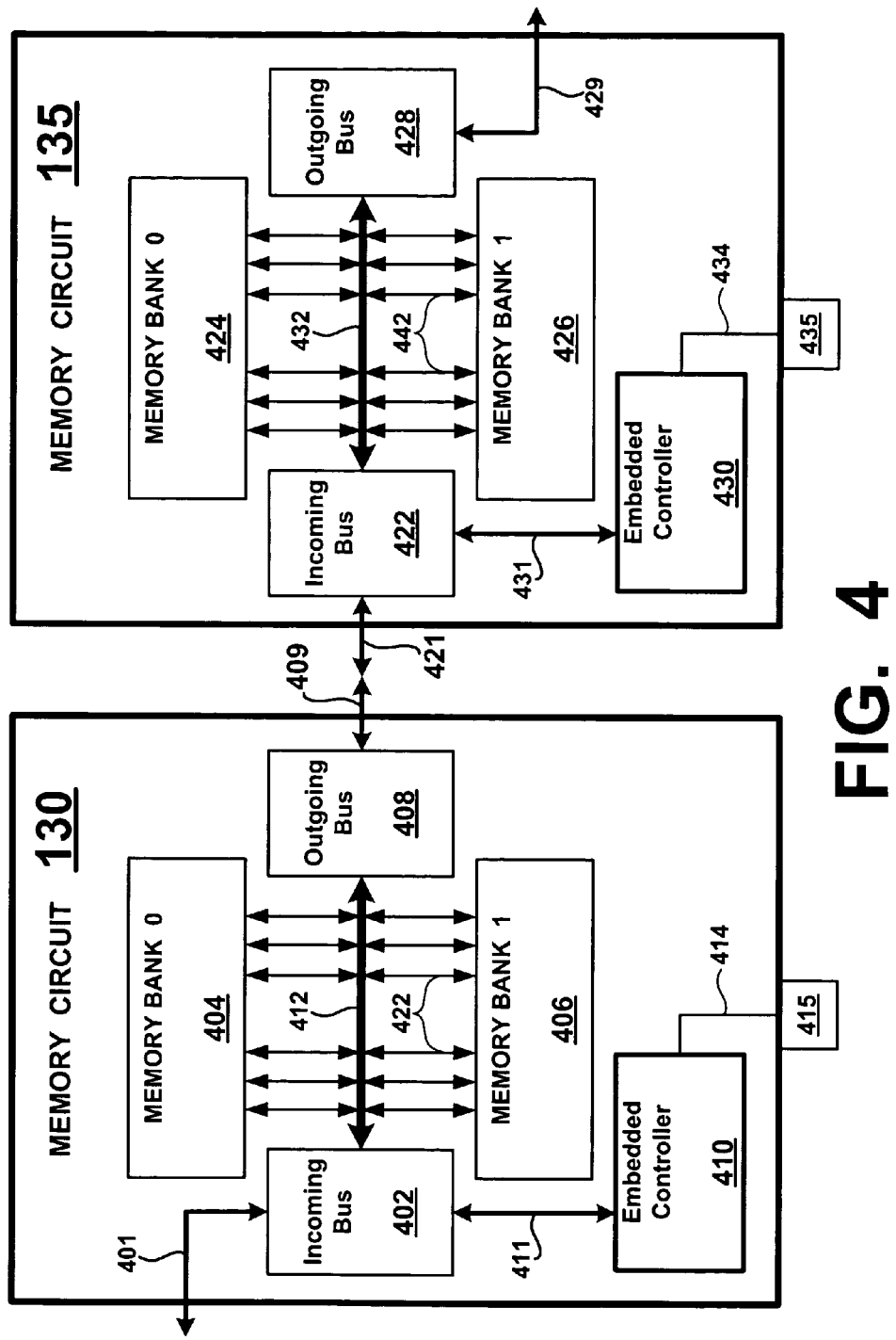
FIG. 4 is an exemplary representation of an alternative embodiment of a memory circuit having an embedded controller.

FIG. 4 is an exemplary representation of two memory circuits 130 and 135, each with an embedded controller 410 and 430. Memory circuit 130 includes memory bank "0" 404 and memory bank "1" 406. Each of the memory arrays within the memory banks may be coupled 422 with a bus 412. The bus 412 receives input via incoming bus 402 and is output via outgoing bus 408. Incoming bus 402 is controlled by embedded controller 410. Outgoing bus 408 is coupled with incoming bus 422 of memory circuit 135. Optional controller enable node 415 is coupled 414 with the embedded controller 410 and enables/disables the operation of the embedded controller 410 so that the same memory circuit 130 could be used in a system with either minimal external memory control functions or strong external memory control functions, such as those described in connection with FIG. 3A.

Memory circuit 135 includes memory bank "0" 424 and memory bank "1" 426. Each of the memory arrays within the memory banks may be coupled 442 with a bus 432. The bus receives input via incoming bus 422 and sends its output via outgoing bus 428. Incoming bus 422 is controlled by controller 430 and optional controller enable node 435 enables/disables the operation of the controller 430. Further details regarding the controlling aspects of the embodiments are illustrated in FIG. 5.

Figure 5:
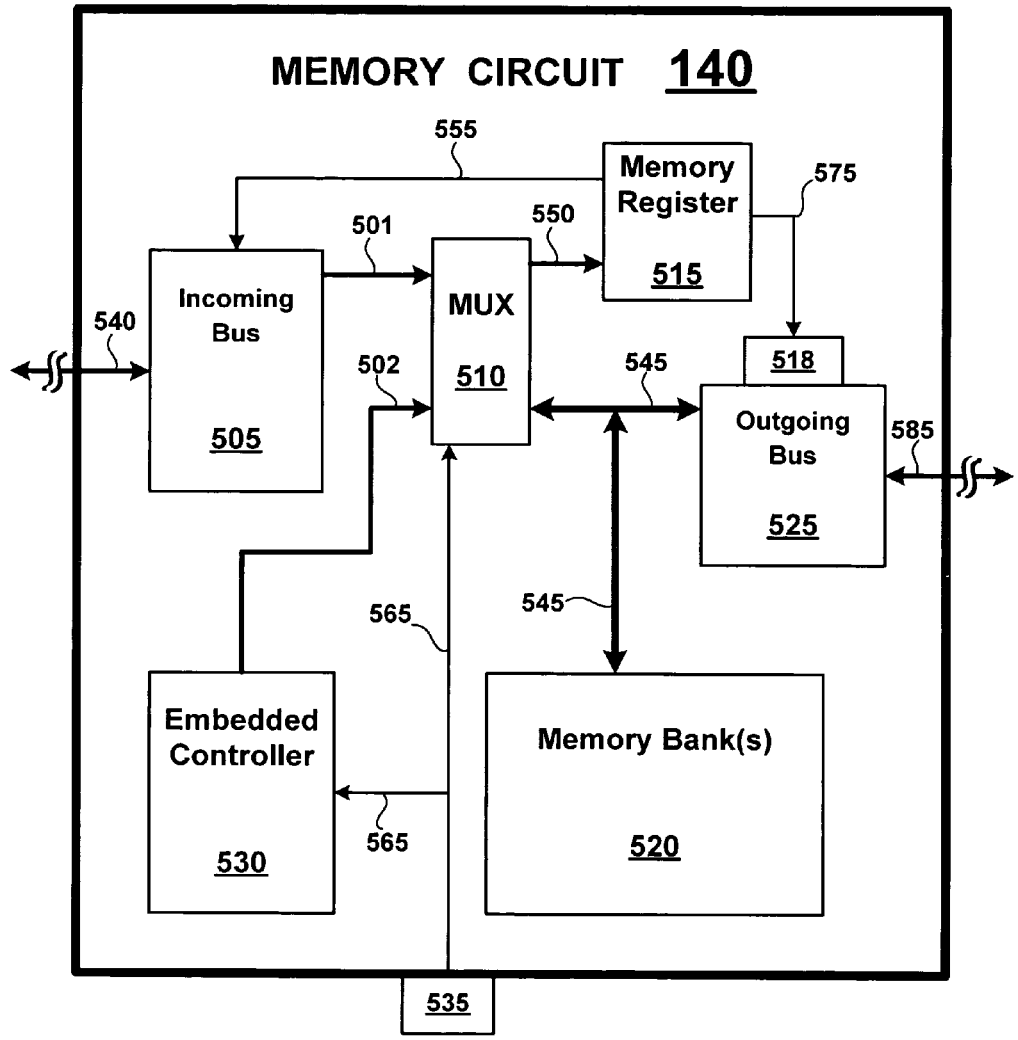
FIG. 5 is an exemplary representation of the control/bus select logic for scaling memory.

FIG. 5 is an exemplary representation of a control/bus select logic implementation for a memory circuit 140 with an embedded controller 530. The incoming bus logic 505 and the embedded controller 530 are the inputs into a multiplexer (MUX) 510. Controller enable node 535 is coupled 565 to both embedded controller 530 and to MUX 510. Controller enable node 535 is a control switch that enables the embedded controller 530 and switches between the two inputs (501, 502) of the MUX 510 so that memory circuit 140 can be used in systems with strong external memory control functions. The MUX 510 is coupled 550 to both a memory register 515 and a bus 545 of the memory circuit 140. The memory register 515 provides for the addressing of the memory bank(s) 520. The bus 545 further connects MUX 510, memory banks 520, and outgoing bus logic 525. Memory register 515 is coupled (555, 575) to both the incoming bus logic 505 and an output enable node 518 of the outgoing bus logic 525. The output enable node 518 is enabled when a valid address is set in the memory register 515 (i.e., an address value other than a power up address). Enabling the output enable node 518 results in the outgoing bus logic 525 enabling output port 585 so that a data access request can be output on the output port 585.

In some embodiments, the bus 545 may be implemented as a parallel bus. In other embodiments the bus 545 may be implemented as a high speed serial bus. In some embodiments, 4 to 8 bits can be used to indicate a bus width of the bus 545. In other embodiments, longer addresses can be used to indicate the bus width.

The writing of the memory register 515 to a valid or enabling address value can be accomplished by the incoming bus logic 505, or the embedded controller 530, depending upon which path is selected. When a write occurs, the memory register 515 is loaded with the valid address of the memory circuit 140. A valid address enables an output enable node 518 coupled with the output bus logic 525, allowing the output bus logic 525 to become active. Once the memory register 515 is written to an enabling/valid address value and the output enable bit 518 is set, a subsequent incoming input on an input port 540 may be processed. Input signals may either be written to memory bank(s) 520 or may be passed through outgoing bus logic 525 to the output port 585, depending on the address being presented on the bus 545. If the address matches the valid address value in memory register 515, a write or read may be generated in memory circuit 140. If the input address does not match the address in memory register 515, the input on the input port 540 may be passed to the output port 585 and be presented to the next memory circuit in the chain. The next memory circuit evaluates the address and may use it or may pass it out to the next memory circuit in the chain. In this manner a large amount of memory may be accessed by the simple daisy-chaining selection and bus passing means.

Figure 6A:
FIG. 6A is an exemplary flow diagram representing the power up controller/bus select logic operations of FIG. 5.
Figure 6A:
Figure 6A:
Figure 6A:
Figure 6A:

FIG. 6A is an exemplary flow diagram representing the power up controller/bus select logic operations. In some embodiments, process 600 illustrates the power up operation of the control logic of FIG. 5. Upon power up, each bank sets its memory register, such as memory register 515 to a non-valid address in process action 602. Process 600 then stops. The non-valid address holds the output enable bit 518 disabled. While the output enable node 518 is disabled, outgoing bus logic 525 prevents the circuit from outputting a signal. For example, at power up, a set of memory registers may be set to a hexadecimal value of FF, which in some embodiments may be designated as an unselected state. The hardware reset will set each memory register (e.g., memory register 515) to a non-valid state regardless of the interface used.

Figure 6B:
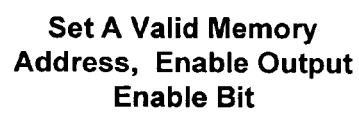
FIG. 6B is an exemplary flow diagram representing the configuration of a memory device of FIG. 5.
Figure 6B:
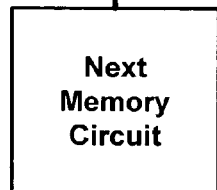
Figure 6B:
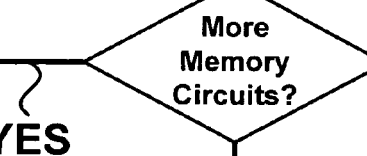
Figure 6B:

FIG. 6B is an exemplary flow diagram representing configuration process 610 of a number of memory devices. The configuration process 610 can take place when a request to access the memory is received for the first time. In process action 612, a valid memory address is written to the memory register 515 and the output enable node 518 is set. The setting of the output enable bit 518 indicates address assignment and allows the outgoing bus logic 525 to become active. Process action 614 determines if there are more memory circuits to configure. If there are more memory circuits, process action 616 selects the next memory circuit and process 610 returns to process action 612 to set the valid address of the selected memory register. If there are no more memory circuits to configure, process 610 stops. In this manner, the memory circuits may be configured sequentially by having the embedded controller coupled to each memory circuit write a value that represents the address of the memory circuit to the corresponding memory register. In some embodiments the address is a 4 to 8 bit address. In other embodiments longer addresses may be used for the memory circuit address.

Figure 6C:
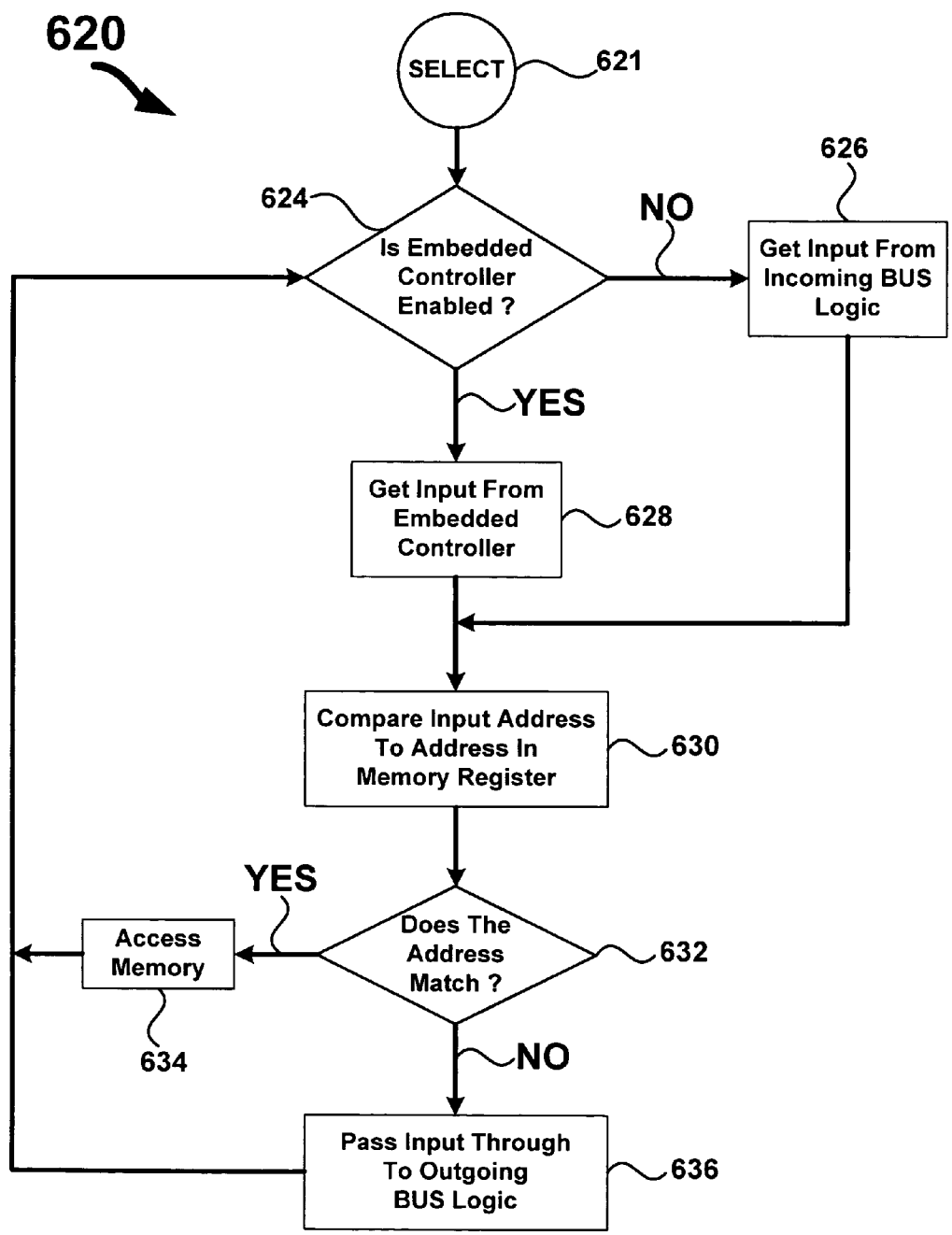
FIG. 6C is an exemplary flow diagram representing the controller/bus select logic operations of FIG. 5.

FIG. 6C is an exemplary flow diagram representing controller/bus select logic operations. Process 620 illustrates the message handling operations of controller bus select logic shown in FIG. 5. Process action 624 determines if embedded controller 530 is enabled, i.e., whether controller enable bit 535 is high. If embedded controller 530 is not enabled, the MUX 510 is set to obtain the input from input bus logic 505 in process action 626. If process action 624 determines that the embedded controller 530 is enabled, then MUX 510 is switched to obtain the input 502 from the embedded controller 530 in process action 628. Process action 630 compares the address in memory register 515 to the address in the input 502 to determine if the incoming message or action is targeted at the current memory circuit 140. Process 632 determines if the comparison results in a match. If the addresses match, memory banks 520 are accessed in process action 634 to perform either a read or write operation depending on the message contents. If the addresses do not match, process action 636 passes the input message to output bus logic 525 to be sent to the subsequent memory circuits in the system.

Although the invention has been described in its presently contemplated best mode, it is clear that it is susceptible to numerous modifications, modes of operation and embodiments, all within the ability and skill of those familiar with the art and without exercise of further inventive activity. There are many alternative ways of implementing the invention. The disclosed exemplary embodiments are illustrative and not restrictive. Accordingly, that which is intended to be protected by Letters Patent is set forth in the claims and includes all variations and modifications that fall within the spirit and scope of the claim.

What is claimed is:

1. A scaleable memory system, comprising:
   a plurality of memory circuits, each memory circuit is fabricated on a substrate and includes
      a register for storing a unique address;
      a bus,
      an input bus logic coupled with the bus and operative to receive a data access request on an input port and to communicate the data access request to the bus,
      an output bus logic coupled with the bus and operative to output data access requests from the bus on an output port, the input bus logic and the output bus logic are operable to be electrically coupled with other memory devices, and
      at least one memory bank having at least one memory array fabricated above the substrate; and
   a memory controller coupled with the input port of one of the plurality of memory circuits, a remainder of the plurality of memory circuits are chained together by coupling the output port of one memory circuit with the input port of another memory circuit, the memory controller operative to receive a data access request, decode the request to determine if an incoming address included in the request matches the unique address of any one of the plurality of memory circuits, directing the data access request to the memory circuit whose unique address matches the incoming address, or passing the request to the outgoing bus of a last of the plurality of memory circuits, wherein the memory controller is an embedded controller coupled with a controller enable node, the controller enable node operative to allow internal control of the incoming bus logic by the embedded controller when enabled and to allow external control of the incoming bus logic by the memory controller when disabled, and the embedded controller, when enabled, is operative to control which data access requests received by the incoming bus logic are passed through the bus to the plurality of memory arrays and which data access requests received by the incoming bus logic are passed through to the bus to the outgoing bus logic.

2. The system as set forth in claim 1 and further comprising: a bus terminator circuit coupled with the output port of a last one of the plurality of memory circuits.

3. The system as set forth in claim 1, wherein the embedded controller, when enabled, passes the data access requests to the plurality of memory arrays if the incoming address matches the unique address stored in the register of the memory circuit.

4. The system as set forth in claim 1, wherein the plurality of memory arrays are non-volatile and retain stored data in the absence of power.

5. The system as set forth in claim 1, wherein memory capacity can be scaled upward by adding at least one memory circuit to the plurality of memory circuits and memory capacity can be scaled downward by removing at least one memory circuit from the plurality of memory circuits.

6. The system as set forth in claim 1, wherein the memory controller is operative to determine an amount of memory contained in the plurality of memory circuits.

7. A memory device, comprising:

memory circuitry fabricated on a substrate and including an embedded controller coupled with a controller enable node and operative to allow internal control of the incoming bus logic by the embedded controller when enabled and to allow external control of the incoming bus logic when disabled, a bus, an input bus logic coupled with the bus and including an input port, an output bus logic coupled with the bus and including an output port and an output enable node, the output enable node operative to enable the output port when enabled, the input bus logic and the output bus logic are operable to be electrically coupled with other memory devices, a multiplexer including a first input coupled with the incoming bus logic, a second input coupled with the embedded controller, and a third input coupled with the controller enable node, the multiplexer operative to select a data access request from the embedded controller when the controller enable node is enabled or to select data access request from the input bus logic when the controller enable node is disabled, a memory register for storing an address received in the data access request, the memory register coupled with the incoming bus logic, the multiplexer, and the output enable node of the outgoing bus logic; and a plurality of memory arrays fabricated above the substrate, each memory array including an interconnect structure coupled with the bus and operative to receive and to respond to data access requests directed to a specific one of the plurality of memory arrays, and wherein a valid address received by the memory register is operative to enable the output enable node and pass the data access request to the plurality of memory arrays and an invalid address is operative to enable the output enable node and pass the data access request through to the output port.

* * * * *